United States Patent [19]

Tsuji et al.

[11] Patent Number: 5,157,003
[45] Date of Patent: Oct. 20, 1992

[54] METHOD OF ETCHING ISOLATION AND ALIGNMENT MARK REGIONS USING A SINGLE RESIST MASK

[75] Inventors: Hitoshi Tsuji, Kawasaki; Hiroshi Haraguchi, Yokohama, both of Japan

[73] Assignee: Kabushiki Kaisha Toshiba, Kawasaki, Japan

[21] Appl. No.: 798,904

[22] Filed: Nov. 27, 1991

[30] Foreign Application Priority Data

Nov. 29, 1990 [JP] Japan .................. 2-331680

[51] Int. Cl.$^5$ .................................... H01L 21/312
[52] U.S. Cl. .................................... 437/229; 437/228; 437/225; 437/924; 148/DIG. 137
[58] Field of Search ............... 437/228, 229, 225, 924; 148/DIG. 102, DIG. 137

[56] References Cited

U.S. PATENT DOCUMENTS

| | | | |
|---|---|---|---|
| 4,088,490 | 5/1978 | Duke et al. | 437/228 |
| 4,893,163 | 1/1990 | Rudeck | 357/40 |
| 4,981,529 | 4/1991 | Tsujita | 437/229 |
| 4,985,374 | 1/1991 | Tsuji et al. | 437/229 |

Primary Examiner—Brian E. Hearn
Assistant Examiner—Trung Dang
Attorney, Agent, or Firm—Foley & Lardner

[57] ABSTRACT

Formation of an isolation region and an alignment mark different in depth in a semiconductor device is disclosed. Phenol resin positive resist has the property that when selective exposure process is implemented to such a resist to apply heat treatment thereto in an amine gas atmosphere such as ammonium, there results the state where only a photosensitive agent at the portion in which light reaction takes place is escaped or gotten away, so this resin portion is insoluble in an alkali developer. By making use of this property, when exposure process is implemented only to the region portions to be etched different in depth to carry out baking, only the position is established by a single mask. Thereafter, only the alignment mark portion required to be deeper of the regions to be etched is etched exposed to light to etch it thereafter to allow only the isolation region to be exposed to light to etch it. Thus, the alignment mark portion becomes deeper than the isolation region by two etching process steps.

4 Claims, 5 Drawing Sheets

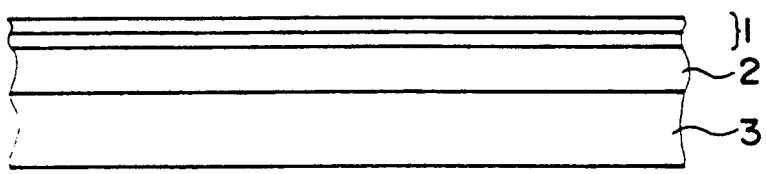
FIG. IA
PRIOR ART
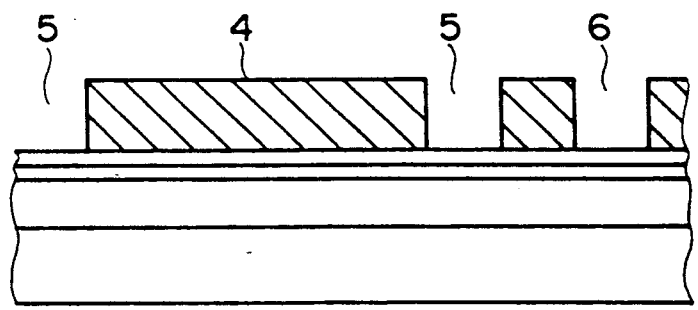
FIG. IB
PRIOR ART
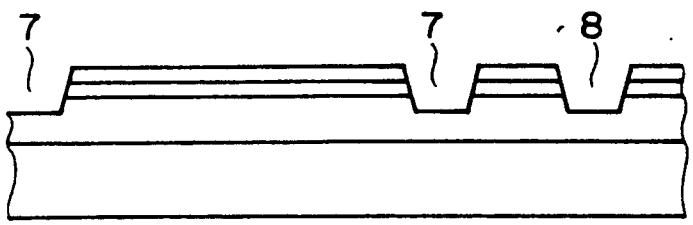
FIG. IC
PRIOR ART

METHOD OF ETCHING ISOLATION AND ALIGNMENT MARK REGIONS USING A SINGLE RESIST MASK

BACKGROUND OF THE INVENTION

This invention relates to a method of manufacturing a semiconductor device, and more particularly, to a lithography technology capable of forming, at a sufficiently depth and with high accuracy, a pattern alignment mark required at the subsequent step in an element having a mesa.

In gallium arsenide (GaAs) devices such as HEMT, etc. of semiconductor devices, an electron supply layer is formed as an epitaxial layer on a gallium arsenide wafer. For this reason, in forming a device, in order to isolate the electron supply layer, it is necessary to remove unwanted regions to form an epitaxial layer (island) in the form of mesa.

Furthermore, ordinarily, at the time of the removal process step of the unwanted region (hereinafter referred to as an isolation region), an alignment mark necessary for a subsequent patterning process step is formed at the same time.

FIGS. 1A to 1C are device cross sections for every process step for explaining an example of a conventional manufacturing method in a gallium arsenide device, respectively. In this manufacturing method, an alignment mark is formed at the same time in removing the isolation region of the electron supply layer.

Initially, as shown in FIG. 1A, a GaAs substrate 3 on which a buffer GaAs layer 2 and an epitaxial layer 1 are formed is prepared. In this case, as the epitaxial layer 1, a composite layer in which $N^+$-GaAs, N-AlGaAs and undope AlGaAs, etc. are epitaxially grown in succession is ordinarily used.

Then, as shown in FIG. 1B, after a resist 4 is coated on the entire surface, a well known technology is used to open an element section electron supply unwanted portion 5 and an alignment mark portion 6. Thereafter, as shown in FIG. 1C, a desired etching is carried out by using the opened resist 4 as a mask to partially remove by etching the epitaxial layer 1 and the buffer GaAs layer 2 at the opened portions to thus form isolation regions 7 and an alignment mark portion 8 at the same time.

In the manufacturing method shown in FIGS. 1A to 1C, the thickness of the epitaxial layer 1 is ordinarily 1000 angstroms or less, and the depth of the etched portion finally formed is 1000 to 2000 angstroms. Thus, a step having a depth of 1000 to 2000 angstroms in a form such that the buffer GaAs layer 2 is partially etched is provided.

FIGS. 2A to 2E show the configuration of a HEMT element made up by the conventional manufacturing method, wherein FIG. 2A is a plan view thereof, and FIGS. 2B and 2C are cross sectional views cut along the lines of X1-X2 and Y1-Y2 of FIG. 2A.

Reference numerals 11 and 12 represent ohmic electrodes and a gate electrode, respectively. At the portions indicated by reference symbols (A) and (B), the gate metal is formed on a step produced by etching of the isolation region. Ordinarily, the thickness of the gate metal is about 3000 to 5000 angstroms and the gate length is 0.25 $\mu$m or less. This gate metal portion is of a structure extruded from the island. Accordingly, for example, at the portion of (A), if the step becomes large, there takes place a step break of the gate electrode 12 as shown in FIG. 2D or a peeling or separation as shown in FIG. 2E. For this reason, there arises the problem that the element characteristic becomes poor, etc.

As a measure for this problem, development of the T-shaped gate, etc. is carried out. However, since the portion in contact with the underlying semiconductor substrate is 0.25 $\mu$m or less, it is impossible to allow the state where there is not a defect such as peeling, etc. by any means to result.

Accordingly, there is limit in depth of the step, so that value cannot be above a fixed value. In this respect, in accordance with the manufacturing method shown in FIG. 1, the step of alignment mark and the step of the isolation region have the same depth. Since that depth of the step is ordinarily 1000 to 2000 angstroms, in the case of a manual mask alignment by visual observation, a pattern alignment at the next process step can be sufficiently carried out by making use of such a step structure. However, in accordance with an automatic alignment system using reflection of a laser light of He-Ne, etc. to detect alignment mark coordinates, mark detection cannot be made by making use of a step having such a depth because of an insufficient output from a reflected light.

For this reason, there takes place the necessity of increasing the depth of the step of the alignment mark. However, with the method of FIG. 1A to 1C, the depth of the step of the isolation region also becomes large, resulting in the previously described peeling of the gate metal, or the like.

Accordingly, it is required to deepen only the step of the alignment mark without changing the depth of the step of the isolation region.

FIGS. 3A to 3E are device cross sections every process steps showing another manufacturing method conventionally proposed. This manufacturing method is characterized in that it comprises initially forming an alignment mark, and thereafter removing unwanted portions.

The process step shown in FIG. 3A is the same as that shown in FIG. 1A. After a resist 4 is coated as shown in FIG. 3B, an alignment mark portion 6 is first opened. Then, as shown in FIG. 3C, by using the resist 4 as a mask, etching of the opened portion is carried out to form a mark portion 8. Thereafter, as shown in FIG. 3D, a resist 9 is coated for a second time to carry out opening of an element section electron supply unwanted portion 5. Finally, as shown in FIG. 3E, by using the resist 9 as a mask, etching of the unwanted portions is carried out to form an unwanted portion 7.

Since etching of the alignment mark and etching of the unwanted portion are separately carried out, it is possible to freely select the depth of the step. Furthermore, since the step of the alignment mark portion 8 can be large, processing can be sufficiently carried out even by the automatic alignment system.

With this method, however, not only the lithographic process step is disadvantageously increased by one, but also it is required to allow for an alignment deviation because there results, from the process steps subsequent thereto, an indirect alignment with a pattern from which the unwanted portions are removed. Namely, there takes place the necessity of taking into account a deviation of $3\sigma \pm 0.5$ $\mu$m or less at the time of design.

SUMMARY OF THE INVENTION

An object of this invention is to provide a method of manufacturing a semiconductor device which carries out resist coating/prebake process at a single process step while preventing the occurrence of defect in the gate metal, which can independently vary the steps of the element section and the alignment section, and which permits the final alignment deviation to be equal to zero.

According to the present invention, there is provided a method of manufacturing a semiconductor device comprising the steps of: depositing an active layer on a semiconductor substrate, coating a positive resist thereon to carry out a first selective exposure by using a mask such that a first region serving as an isolation region and a second region corresponding to an alignment mark are subjected to light-shielding in order to form grooves in said active layer, baking said semiconductor substrate which has undergone said first selective exposure in a predetermined gas atmosphere thus to allow the portion exposed to light to be insoluble in a developer, carrying out a second selective exposure by using a mask such that said first region is subjected to light-shielding and said second region is exposed to light thereafter to carry out a first development thus to remove said resist in said second region, etching, by using said resist which has undergone said first development as a mask, said active layer in said second region so that it has a desired depth, carrying out a third selective exposure by using a mask such that said first region is exposed to light and said second region is subjected to light-shielding thereafter to carry out a second development thus to remove said resist in said first region, and etching, by using said resist which has undergone said second development as a mask, said active layer in said first and second regions so that it has a desired depth thus to provide a structure in which said second region is deeper than said first region.

The key teaching of a method of manufacturing a semiconductor device according to this invention resides in utilization of the property of the phenol resin positive resist which will be described below. Namely, when the selective exposure process is implemented to phenol resin positive resist to apply heat treatment thereto in an amine gas atmosphere such as ammonium, etc., there results, the state where only a photosensitive agent at the portion in which light reaction takes place is escaped or gotten away, so this resist portion becomes insoluble in an alkali developer. When the exposure process is implemented only region portions to be etched different in depth to carry out baking, only the position is established by a single mask. Thereafter, only the alignment mask portion required to be deeper of the region portions to be etched is exposed to light to etch it thereafter to allow only the isolation region to be exposed to light to etch it. Thus, the alignment mark portion becomes deeper than the isolation region by two etching process steps.

As stated above, in accordance with this invention, it is possible to allow the steps to be different from each other while maintaining the positional accuracy between the element section electron supply layer isolation region (first region) and the alignment section (second region). Thus, percent defective in the automatic positioning in the manufacturing process can be reduced to much degree. Further, since it is sufficient to carry out of resist coating/prebaking process to resist at a single process step, cost can be reduced.

BRIEF DESCRIPTION OF THE DRAWINGS

In the accompanying drawings;

FIGS. 1A to 1C are device cross sections every process steps for explaining a conventional manufacturing method, respectively, FIGS. 2A to 2E are views showing the structure of a HEMT element wherein FIG. 2A is a plan view thereof, FIGS. 2B and 2C are cross sectional views thereof, and FIGS. 2D to 2E are cross sectional views for explaining step break and peeling of the gate metal portion, respectively.

DESCRIPTION OF THE PREFERRED EMBODIMENT

An embodiment in the case where this invention is applied to a HEMT process will now be described.

Figure 2A:
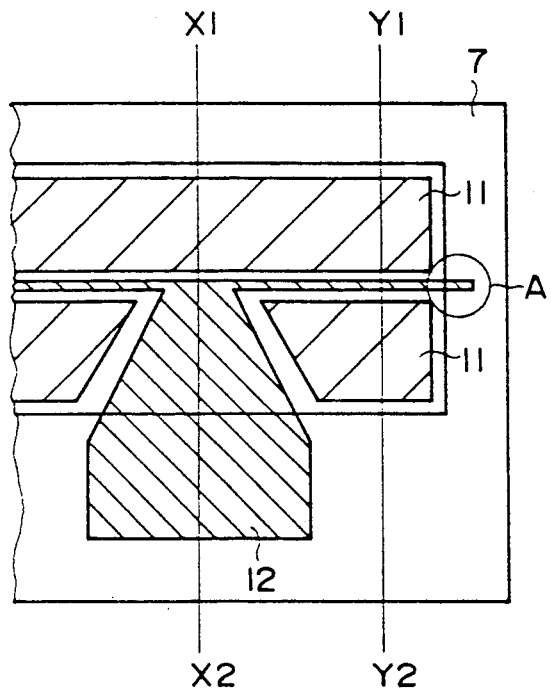
Figure 2D:
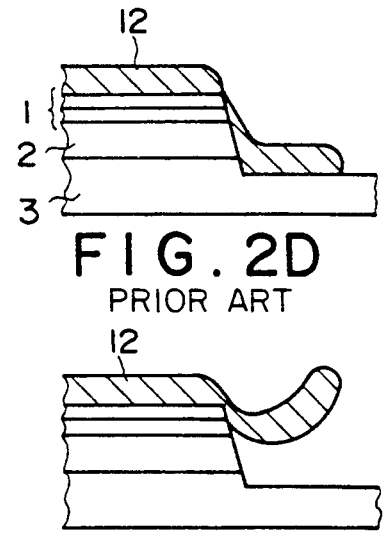
Figure 2E:
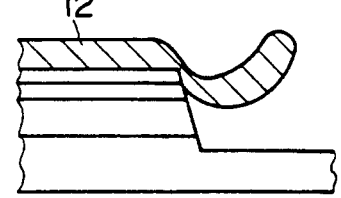
Figure 2B:
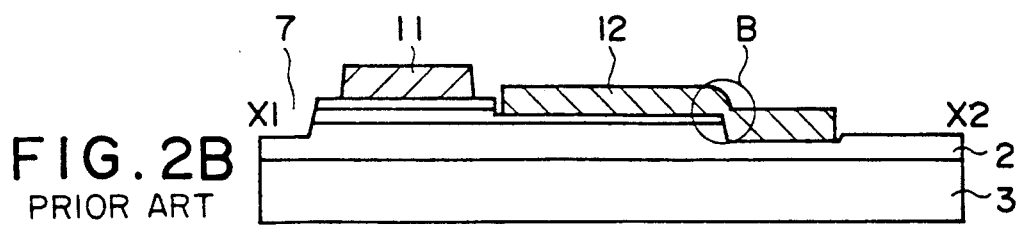
Figure 2C:
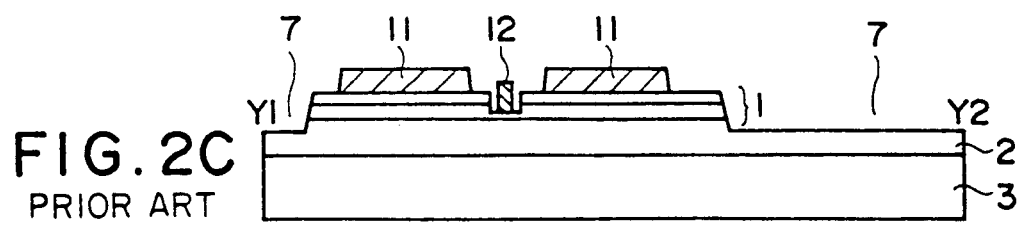
Figure 3A:
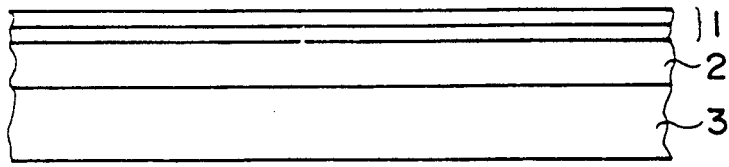
FIG. 3A to 3E are device cross sections every process steps for explaining another conventional manufacturing method.
Figure 3B:
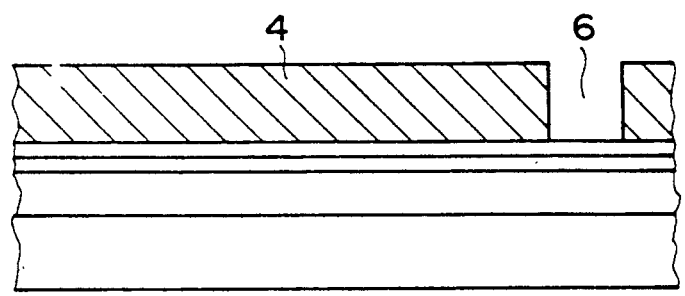
Figure 3C:
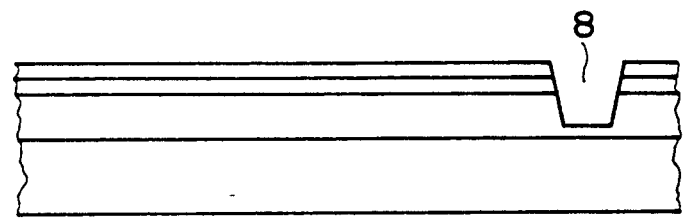
Figure 3D:
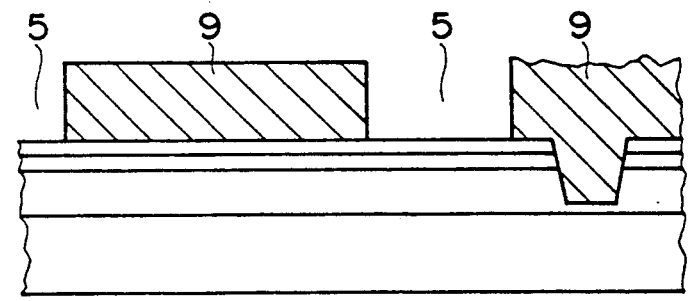
Figure 3E:
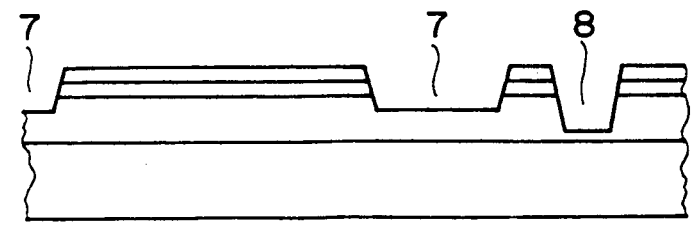
Figure 4A:
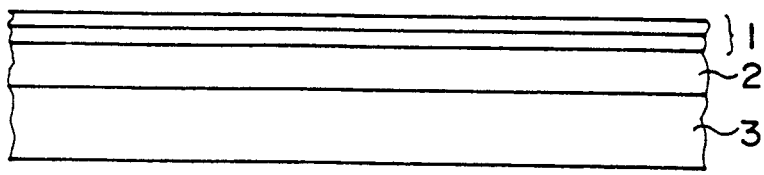
FIGS. 4A to 4G are device cross sections every process steps showing a first embodiment of this invention, respectively.
Figure 4B:
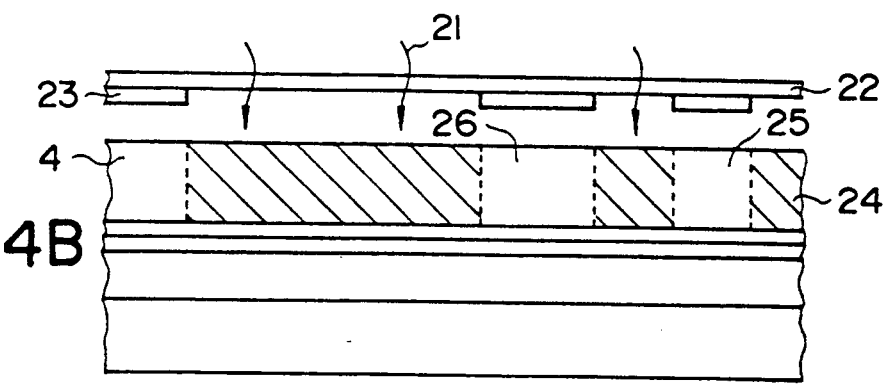

FIGS. 4A to 4G are device cross sections every process steps showing an applied example to the HEMT process, respectively. Initially, an epitaxial layer 1 and a buffer layer 2 are deposited on a substrate 3 as shown in FIG. 4A to coat resist on the entire surface thereof as shown in FIG. 4B. It is to be noted that NPR-820DX (Trade name) by Nagase Sangyo is used as the resist in this embodiment. This resist is a positive photoresist comprised of phenol resin and a photosensitive agent.

Then, as shown in FIG. 4B, a mask 22 having chromium layers in the isolation regions between the alignment mark portion and the element section electron supply layer and serving to light-shield ultraviolet ray 21 is used to carry out exposure of the resist. Thus, the resist is separated into a light reactive portion 24 and non-light reactive portion resists 25 and 26.

The semiconductor substrate which has experienced the exposure process is subjected to baking at 90° to 100° C. in an amine gas atmosphere such as ammonium, etc. without undergoing development process.

Generally, the portion exposed to radiation of the positive resist becomes soluble by alkali developer, but the light reactive portion exposed to radiation is brought into the state where the photosensitive agent is escaped or gotten away. As a result, this light reactive resist becomes insoluble in alkali developer.

Figure 4C:
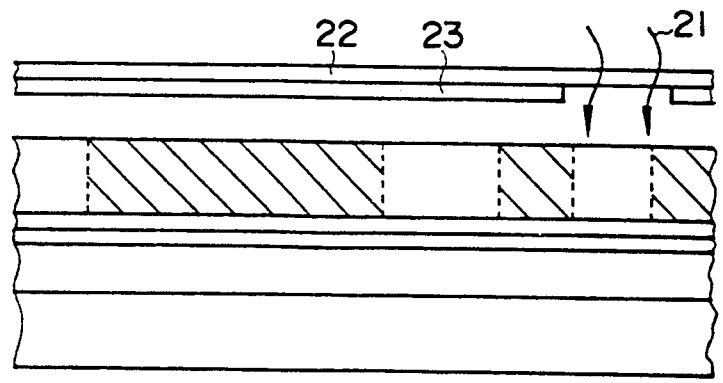
Figure 4D:
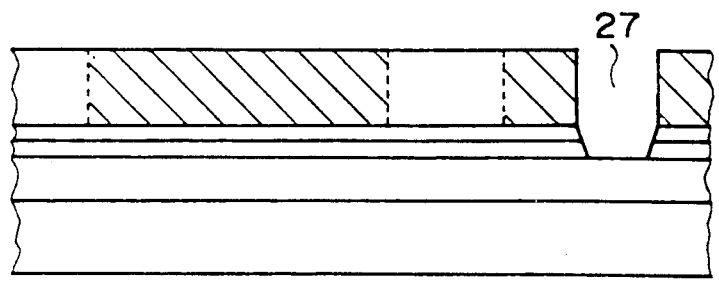

Then, as shown in FIG. 4C, exposure process is implemented to the semiconductor substrate subjected to baking by using a mask 22 having a chromium layer 23 such that selective exposure is applied only to the alignment mark portion. At this time, setting should be made such that the opening portion of the chromium layer 24 subjected to light transmission is sufficiently large. The reason why such a setting is made is as follows. Namely, since the portion in which the photosensitive agent is left is determined by an initial exposure in advance, that portion is permitted to be sufficiently exposed to radiation. After exposure, when alkali developer such as tetramethyl amine (TMAH) or choline, etc. is used to carry out development, the resist 25 at the portion exposed to radiation is dissolved and is thus removed. Then, as shown in FIG. 4D, the resist thus patterned is used to etch the underlying epitaxial layer 1 so that the depth thereof is equal to 2000 to 3000 angstroms.

Figure 4E:
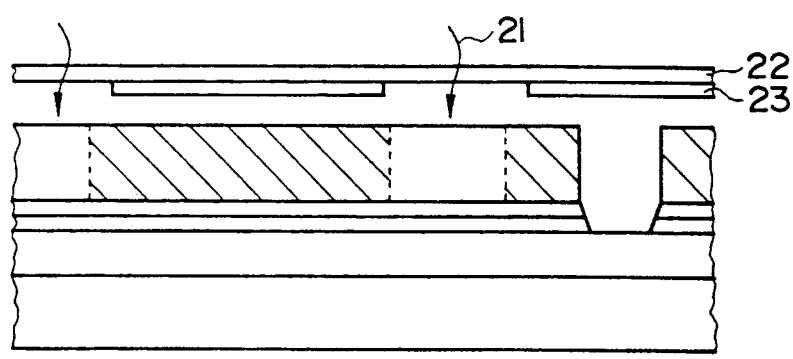

Then, as shown in FIG. 4E, a mask 22 having chromium layers 23 such that only the isolation region of the electron supply layer of the element section is exposed to radiation is used to carry out selective exposure. When that article thus obtained is developed in alkali developer, the resist 26 existing in the isolation region of the electron supply layer is removed.

Figure 4F:
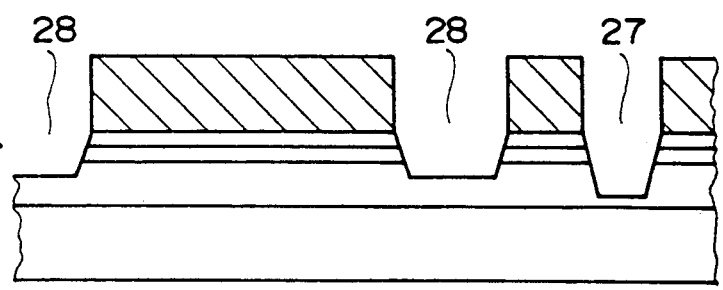

The final resist pattern thus obtained is used to additionally etch the epitaxial layer 1 so that the depth thereof is equal to 1000 to 2000 angstroms. Thus, as shown in FIG. 4F, an element having a step shallow in the isolation region 28 of the element section electron supply layer and deep in the alignment mark portion 28 is formed.

Figure 4G:
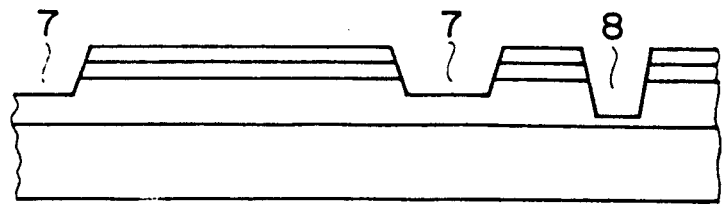

As shown in FIG. 4G, a step having a depth of 3000 to 5000 angstroms at the alignment mark portion 8, which is deeper than those of the isolation regions 7 of the element section electron supply layer, can be finally formed.

While explanation has been given in the above-described embodiment in connection with the case where positive phenol resin is used, image reversal resist including Imidazole, Monozoline, Triethanolamine, or the like may be used in place of phenol resin used in the above-described embodiment to carry out patterning. Also, in the case where such an image reversal resist is used, an element having different steps could be similarly formed.

In addition, while, in etching the epitaxial layer, wet etching was used in the case of this embodiment, if such an etching process is implemented by making use of dry etching, patterning of resist may be conducted. Also in this case, a satisfactory etching pattern can be provided.

As stated above, in accordance with a method of manufacturing a semiconductor device according to this invention, by making use of the property that when selective exposure is implemented to phenol resin positive resist to apply heat treatment thereto, such a resist becomes insoluble in alkali developer, exposure process is implemented only to the region portion to be etched different in depth to carry out baking to establish only the position by a single mask thereafter to allow them to be different in depth by etching. Accordingly, since a relative position between the element electron supply layer isolation region (first region) and the alignment mark portion (second region) is determined in advance, it becomes unnecessary to allow for a quantity of deviation due to indirect alignment, and it is possible to carry out resist coating/prebaking process to resist at a single process step. Thus, cost can be reduced.

What is claimed is:

1. A method of manufacturing a semiconductor device
    depositing an active layer on a semiconductor substrate,
    coating a positive resist thereon to carry out a first selective exposure by using a mask such that a first region serving as an isolation region and a second region corresponding to an alignment mark are subjected to light-shielding in order to form grooves in said active layer,
    baking said semiconductor substrate which has undergone said first selective exposure in a predetermined gas atmosphere thus to allow the portion exposed to light to be insoluble in a developer,
    carrying out a second selective exposure by using a mask such that said first region is subjected to light-shielding and said second region is exposed to light thereafter to carry out a first development to thus remove said resist in said second region,
    etching, by using said resist which has undergone said first development as a mask, said active layer in said second region so that it has a desired depth,
    carrying out a third selective exposure by using a mask such that said first region is exposed to light and said second region is subjected to light-shielding thereafter to carry out a second development thus to remove said resist in said first region, and
    etching, by using said resist which has undergone said second development as a mask, said active layer in said first and second regions so that it has a desired depth thus to provide a structure in which said second region is deeper than said first region.

2. A method of manufacturing a semiconductor device as set force in claim 1, wherein said positive resist is phenol resin resist, and gas is amine gas.

3. A method of manufacturing a semiconductor device as set force in claim 1, wherein said positive resist is an image reversal resist of which the characteristic is reversed by heat treatment.

4. A method of manufacturing a semiconductor device as set force in claim 1, wherein said active later is comprised of a buffer layer and an epitaxially grown current supply layer formed on a gallium arsenide substrate.

* * * * *